United States Patent
El-Damak et al.

(10) Patent No.: US 9,473,092 B2
(45) Date of Patent: Oct. 18, 2016

(54) RECONFIGURABLE AMPLIFIER

(71) Applicant: Texas Instruments Incorporated, Dallas, TX (US)

(72) Inventors: Dina Reda El-Damak, Cambridge, MA (US); Rajarshi Mukhopadhyay, Allen, TX (US); Jeffrey Anthony Morroni, Highlands Ranch, CO (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/587,863

(22) Filed: Dec. 31, 2014

(65) Prior Publication Data

US 2016/0191006 A1    Jun. 30, 2016

(51) Int. Cl.
*H03F 3/45* (2006.01)

(52) U.S. Cl.
CPC ...... *H03F 3/45645* (2013.01); *H03F 3/45273* (2013.01); *H03F 2203/45002* (2013.01); *H03F 2203/45078* (2013.01); *H03F 2203/45116* (2013.01)

(58) Field of Classification Search
CPC ......................................... H03F 3/45
USPC .......................................... 330/253, 257, 261
See application file for complete search history.

(56) References Cited

U.S. PATENT DOCUMENTS 5,734,297 A * 3/1998 Huijsing ............. H03F 3/45121
330/253

* cited by examiner

*Primary Examiner* — Steven J Mottola
(74) *Attorney, Agent, or Firm* — Michael A. Davis, Jr.; Frank D. Cimino

(57) ABSTRACT

An amplifier receives a differential signal and, in response, generates a first negative input current and a first positive input current. In a first operating mode, the amplifier receives a second differential signal, and, in response, generates a second negative input current and a second positive input current. In a second operating mode, the amplifier receives the second differential signal, and, in response, generates a third negative input current and a third positive input current. When the device is operating in the first operating mode, the first negative input current is summed with the second negative input current and the first positive input current is summed with the second positive input current. When the device is operating in the second operating mode, the first negative input current is summed with the third negative input current and the first positive input current is summed with the third positive input current.

17 Claims, 4 Drawing Sheets

RECONFIGURABLE AMPLIFIER

BACKGROUND

The disclosures herein relate in general to electronic amplifiers, and in particular to amplifiers that are reconfigurable.

Amplifiers are useful for sensing small differential input signals in applications such as direct current resistance (DCR) measurements to determine inductor currents in buck converters. Such applications can require substantially wide common mode input ranges as well as can require high bandwidth and low quiescent current consumption. However, difference amplifiers adversely affect the time constants of DCR networks, while instrumentation amplifiers require three operational amplifiers, which can require substantially greater amounts of quiescent current consumption and design complexity.

SUMMARY

An amplifier receives a differential signal and, in response, generates a first negative input current and a first positive input current. In a first operating mode, the amplifier receives a second differential signal, and, in response, generates a second negative input current and a second positive input current. In a second operating mode, the amplifier receives the second differential signal, and, in response, generates a third negative input current and a third positive input current. When the device is operating in the first operating mode, the first negative input current is summed with the second negative input current and the first positive input current is summed with the second positive input current. When the device is operating in the second operating mode, the first negative input current is summed with the third negative input current and the first positive input current is summed with the third positive input current.

DETAILED DESCRIPTION

Figure 1:
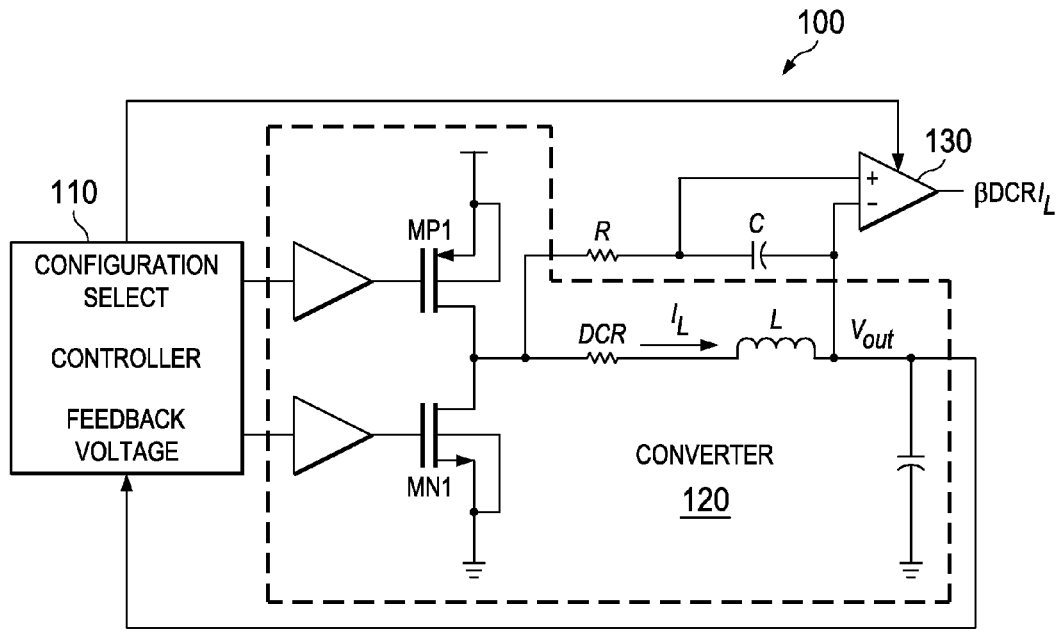
FIG. 1 is a schematic diagram of a system of the illustrative embodiments.

FIG. 1 is a schematic diagram of a system, indicated generally at 100, of the illustrative embodiments. The system 100 includes a controller 110, a converter 120, and a differential amplifier 130. The controller 110 controls: (a) the operation of converter 120; and (b) controls the configuration of amplifier 130.

To control the operation of converter 120, the controller 110: (a) receives an indication of the power output from the converter 120 (e.g., where the received indication contains output voltage and/or output current information); (b) compares the output voltage against a voltage reference; and (c) in response to the comparison, generates signals suitable for controlling the power transistors MP1 and MN1 of the converter 120.

To control the configuration of the amplifier 130, the controller 110: (a) determines a mode of operation for operation of the amplifier 130 in response to, for example, the received indication of the power output; and (b) generates signals suitable for driving mode switches of the amplifier 130.

The converter 120 is, for example, a buck converter. The converter 120 includes: (a) a high-side power transistor MP1; (b) the low-side power transistor MN1; and (c) an inductor L that has an equivalent series resistance DCR (e.g., which is distributed through the coils of the inductor L). The power transistors MP1 and MN1 are operable to charge and discharge the inductor L. The equivalent-series resistance DCR has a resistance, for example, that is approximately 100 milli-Ohms across which a voltage is developed in response to the instantaneous inductor current ($I_L$).

The amplifier 130 has a differential input (e.g., 220 or 230, discussed below) that is coupled to a "DCR network," which includes: (a) a resistor R; and (b) a capacitor C. The values of the resistor R, the capacitor C are selected (e.g., by a circuit designer) such that the resulting RC time constant is equal to the resulting L/DCR time constant. The components of the DCR network are coupled in parallel with the inductor L: where, (a) a first terminal of resistor R and a first terminal of the L are mutually coupled to both drains of the power transistors MP1 and MN1; (b) a second terminal of resistor R is coupled to a positive terminal of capacitor C and to the non-inverting input of amplifier 130; and (c) the negative terminal of capacitor C is coupled to the second terminal of inductor L and the feedback voltage input of controller 110. The inputs of the controller 110 and the amplifier 130 that are coupled to the DCR network are high impedance inputs such that the values of the RC time constant and L/DCR time constant are not substantially affected.

The amplifier 130 is operable to amplify the voltage developed across capacitor C, where the amplification has a gain of beta (β). The voltage developed across capacitor C is:

$$V_c = DCR I_L \text{ if } RC = \frac{L}{DCR} \quad (1)$$

where $V_C$ is the voltage developed across capacitor C. When the resistor DCR is approximately 100 milli-Ohms, the differential voltage generated across capacitor C is on the order of tens of millivolts. Accordingly, the amplifier 130 is suitable for sensing such differential voltages. The amplifier 130, for example, has a low input referred offset of approximately one millivolt and a high open loop gain of greater than approximately 80 decibels (dB).

As introduced above, the amplifier 130 is operable to be configured for operating in different operating modes, such as: (a) a low common mode input range operating mode for sensing differential input signals (e.g., having a low common mode voltage); and (b) a high common mode input range operating mode for sensing differential input signals (e.g., having a high common mode voltage). The amplifier 130 is suitable for use in, for example, wide input range difference circuits with high input impedance.

Figure 2:
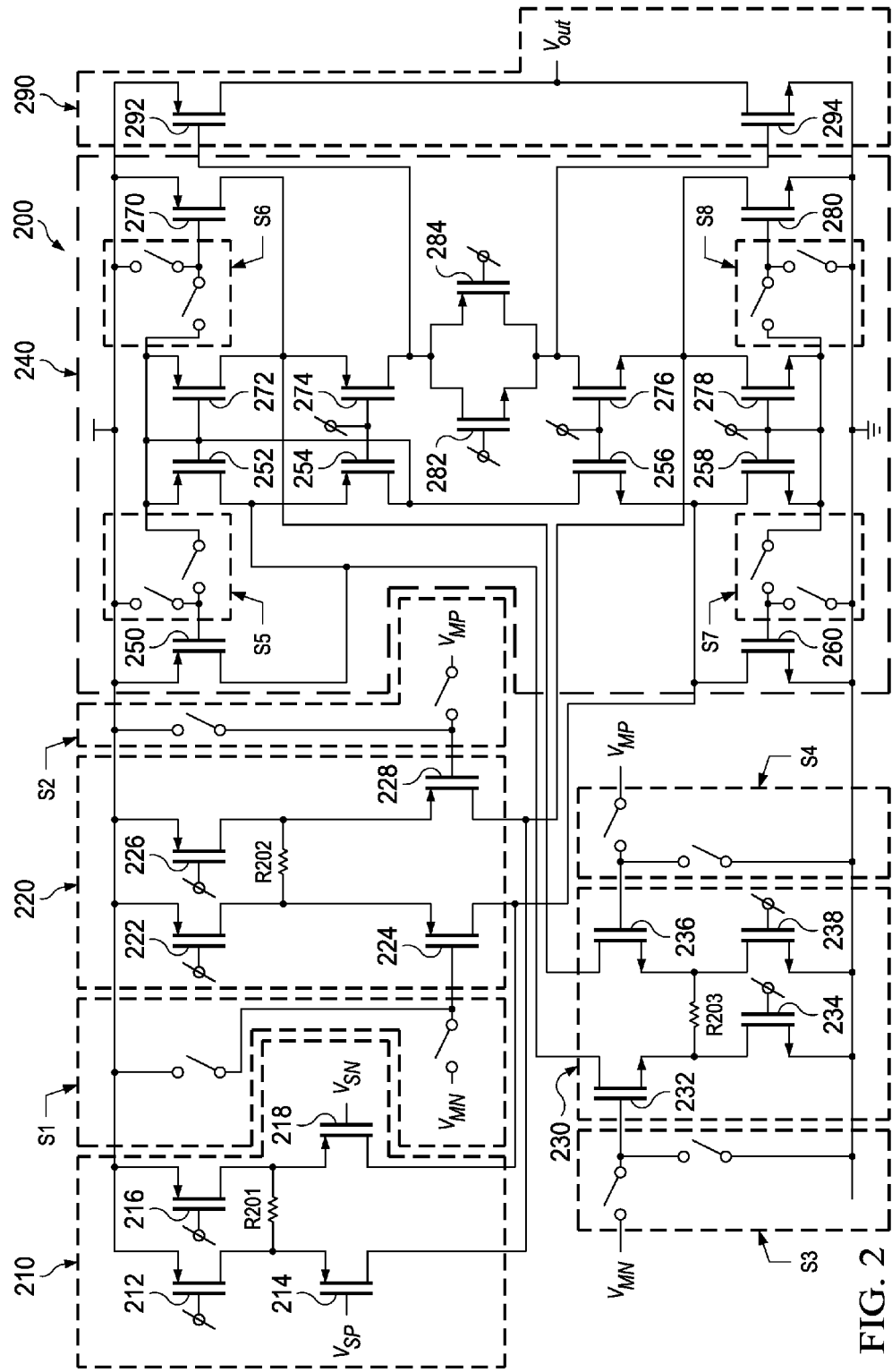
FIG. 2 is a schematic view of the amplifier 130 of FIG. 1.

FIG. 2 is a schematic view of the amplifier 130 of FIG. 1. As shown in FIG. 2, the amplifier 130 includes: (a) a P-type (PMOS) secondary pair 210; (b) a P-type main input pair and 220; (c) an N-type (NMOS) main input pair 230; (d) a gain stage 240; and (e) the output stage 290. The amplifier 130 also includes: switches S1, S2, S7 and S8 that are operable to selectively couple and decouple the main input pair 220 to and from active circuitry of the amplifier 130, such that the P-type main input pair 220 is respectively activated and deactivated; and (b) switches S3, S4, S5 and S6 that are operable to selectively couple and decouple the N-type main input pair 230 to and from active circuitry of the amplifier 130 such that the main input pair 230 is respectively activated and deactivated.

For example, the P-type main input pair 220 is coupled to active circuitry and the N-type input pair 230 is decoupled from active circuitry of the amplifier 130 when the amplifier 130 is operating in the low common mode input range operating mode, while the N-type main input pair 230 is coupled to the active circuitry and P-type input pair 220 is decoupled from active circuitry of the amplifier 130 when the amplifier 130 is operating in the high common mode input range operating mode.

The operation of the active components of the amplifier 130 while operating in a low common mode input range is discussed below with reference to FIG. 3. The operation of the active components of the amplifier 130 while operating in a high common mode input range is disclosed below with reference to FIG. 4.

Figure 3:
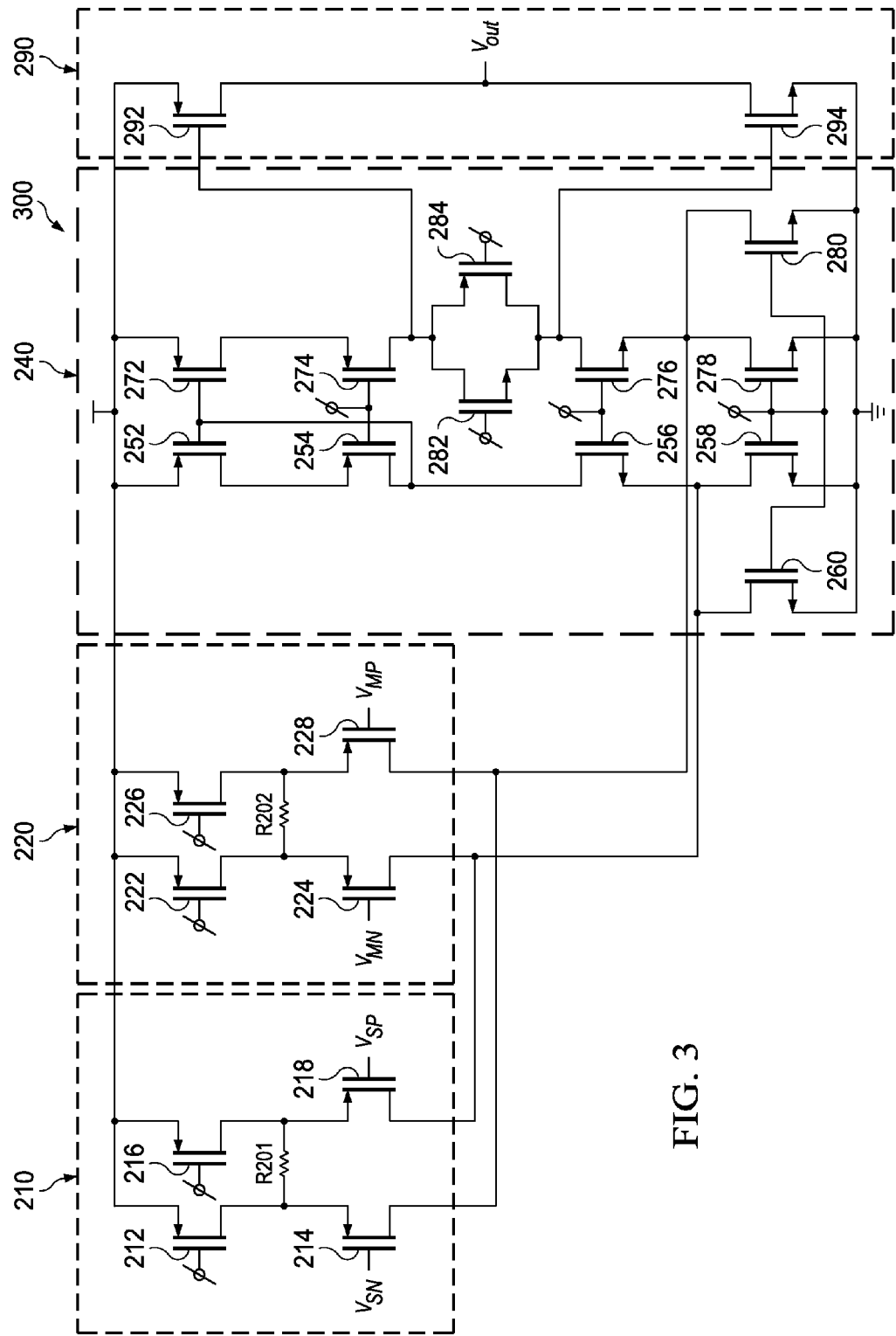
FIG. 3 is a schematic view of the amplifier 130 of FIG. 2 operating in a low common mode input range operating mode.

FIG. 3 is a schematic view of the amplifier 130 of FIG. 2 operating in a low common mode input range operating mode. For clarity, switches S1, S2, S3, S1, S5, S6, S7 and S8 are drawn as solid lines where poles of the switches are closed, while non-functional circuitry (such as the open holes of switches and non-contributing circuitry) is not shown in FIG. 3.

The secondary pair 210 includes: (a) PMOS (P-type metal on silicon) transistors 212, 214, 216 and 218; and (b) resistor R201. The non-inverting "leg" of the secondary pair 210 includes the transistors 212 and 214, whereas the inverting leg of the secondary pair 210 whereas the transistors 216 and 218. The source of the transistor 212 is coupled to the positive supply rail of the amplifier 130, while the drain of the transistor 212 is coupled to the source of the transistor 214 and a first terminal of the resistor R201. The source of the transistor 216 is coupled to the positive supply rail of the amplifier 130, and a drain of transistor 216 is coupled to the source of the transistor 218 and a second terminal of the resistor R201.

A common bias voltage phi (ϕ) is used to equally bias the respective gates of the transistors 212 and 216 such that an equal amount of current respectively flows through the transistors 212 and 216. The resistor R201 is operable to generate a differential voltage across its first and second terminals in response to the respective currents of the transistors 214 and 218.

The gates of the transistors 214 and 218 are coupled to terminals of the amplifier 130. The gate of the transistor 214 is operable to control a current (e.g., a first positive input current) in response to the secondary pair non-inverting input of the amplifier 130, whereas transistor 218 is operable to control a current (e.g., a first negative input current) in response to the secondary pair inverting input of the amplifier 130.

The drain of the transistor 214 is coupled to (for example) the drain of the transistor 278 such that the current from the transistor 214 is summed with the current from the transistor 276. Similarly, the drain of the transistor 218 is coupled to (for example) the drain of the transistor 258 such that the current from the transistor 218 is summed with the current from the transistor 256.

The P-type main input pair 220 includes: (a) PMOS transistors 222, 224, 226 and 228; and (b) resistor R202. The transistors 222 and 224 control and comprise the inverting leg of the P-type main input pair 220, whereas the transistors 226 and 228 control and comprise the non-inverting leg of the main pair 220. The source of the transistor 222 is coupled to the positive supply rail of the amplifier 130, while the drain of the transistor 222 is coupled to the source of the transistor 224 and a first terminal of the resistor R202. The source of the transistor 226 is coupled to the positive supply rail of the amplifier 130, and a drain of transistor 226 is coupled to the source of the transistor 228 and a second terminal of the resistor R202.

The common bias voltage phi (ϕ) is used to equally bias the respective gates of the transistors 222 and 226 such that an equal amount of current flows through the transistors 222 and 226. The resistor R202 is operable to generate a differential voltage across its first and second terminals in response to the respective currents of the transistors 224 and 228.

The gates of the transistors 224 and 228 are selectively coupled to terminals of the amplifier 130 in the low common mode input range operating mode. Transistors 224 and 228 are a differential input pair. The transistor 224 is operable to control a current (e.g., a second negative input current) in response to the main pair inverting input of the amplifier 130, whereas transistor 228 is operable to control a current (e.g., a second positive input current) in response to the main pair non-inverting input of the amplifier 130.

The drain of the transistor 224 is coupled to (for example) the drain of the transistor 258 such that the currents from the transistor 218 and the transistor 224 are summed with the current from the transistor 256. Similarly, the drain of the transistor 228 is coupled to (for example) the drain of the transistor 278 such that the currents from the transistor 214 and the transistor 228 are summed with the current from the transistor 276.

The active components of gain stage 240 include: (a) PMOS transistors 252, 254, 272, 264 and 284; and (b) NMOS (N-type metal on silicon) transistors 256, 258, 260, 276, 278, 280 and 282. The transistors 252, 254, 256, 258 and 260 control and comprise the "reference" leg of the gain stage 240, whereas the transistors 272, 274, 276, 278 and 280 control the "output" leg of the gain stage 240. The reference leg of the gain stage 240 generates the bias voltage (e.g., the voltage developed at the drain of the transistor 254) for the current mirror formed by transistors 252 and 272. The output leg includes transistors 282 and 284, which: (a) are arranged as a transmission gate; (b) are operable to transmit the positive or negative current in either direction equally between the outputs (e.g., the drains of the transistors 274 and 276) of the gain stage 240; and (c) are operable to control the bias for class A-B output state.

The current mirror formed by the arrangement of the transistors 252 and 272 is operable to ensure an equal amount of current is supplied to each of the reference leg and the output leg of the gain stage 240. Accordingly, equal currents flow from the drain of the transistor 254 and from the drain of the transistor 274. The summed currents at the drains of the transistors 258 and 260 affect the voltage developed between the drains of the transistor 254 and the transistor 256 (which is the bias voltage of the current mirror of the gain stage 240). Accordingly, the current in the output leg of the gain stage 240 is controlled in part by the summed currents at the drains of the transistors 258 and 260.

The current in the output leg of the gain stage 240 is also controlled by the currents summed at the drains of the transistors 278 and 280. The currents summed at the drains of the transistors 278 and 280 affect the voltage developed at the drain of the transistor 276 (which is coupled to the gate of the output stage 290 transistor 294) as well as the voltage developed at the drain of the transistor 274 (276 (which is coupled to the gate of the output stage 290 transistor 292). Accordingly, each of the four inputs (e.g., the main pair inverting input, the main pair non-inverting input, the secondary pair inverting input, and the secondary pair non-inverting input) to the amplifier 130 potentially contribute to the output of the output stage 290.

The output stage 290 includes: a PMOS transistor 292; and an NMOS transistor 294. The drains of the transistors 292 and 294 are coupled together to form the node Vout. The transistors 292 and 294 amplify the input differential signals and generate a "one-sided" output in accordance with a predetermined gain factor. The amplification gain for operating in the low common mode input range operating mode is the same as the gain for operating in the high common mode input range operating mode discussed below with respect to FIG. 4. In an embodiment, an output of 300 millivolts is generated in response to differential input of 100 millivolts while operating in either the low common mode input range operating mode or the high common mode input range operating mode.

Figure 4:
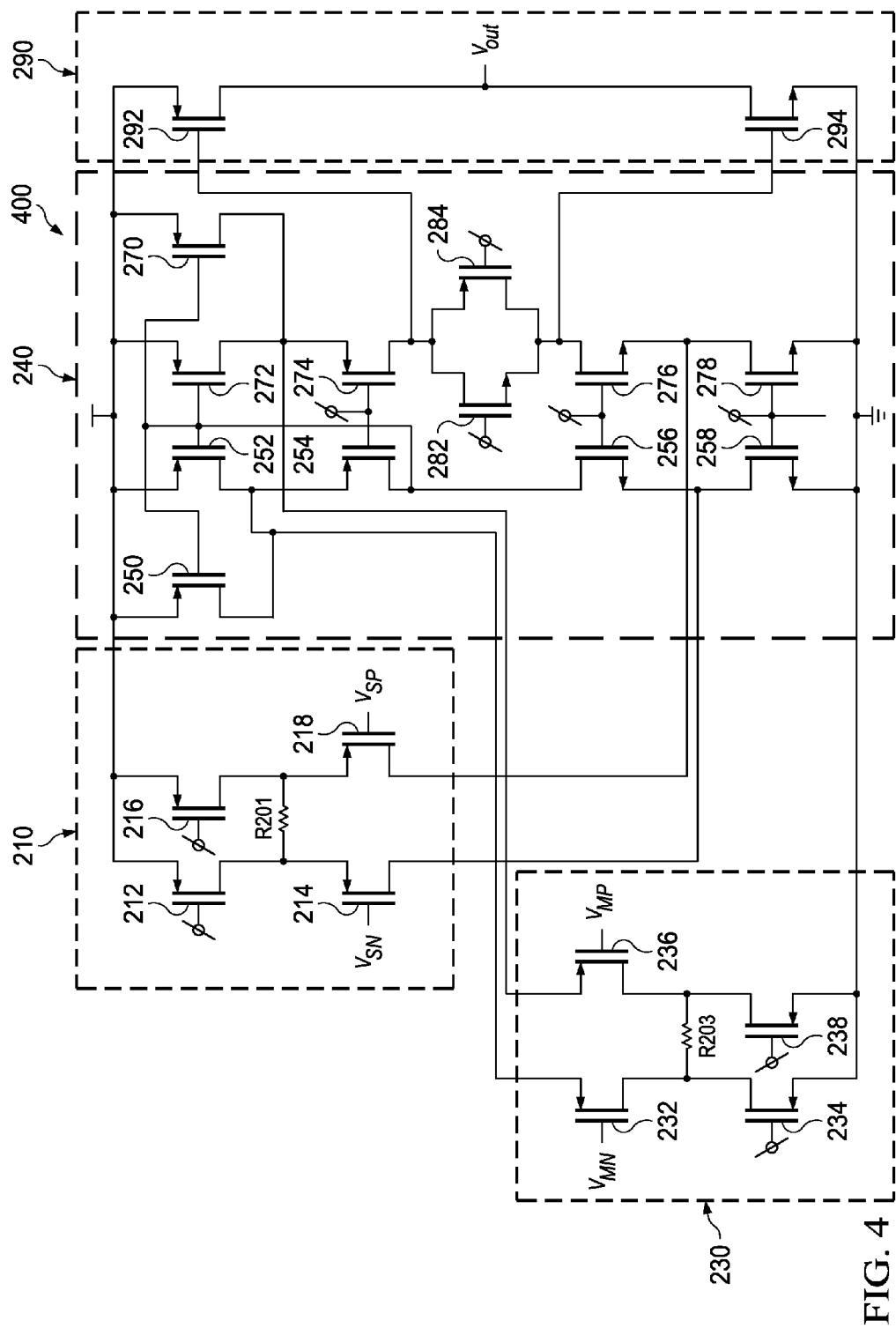
FIG. 4 is a schematic view of the amplifier 130 of FIG. 2 operating in a high common mode input range operating mode.

FIG. 4 is a schematic view of the amplifier 130 of FIG. 2 operating in a high common mode input range operating mode. For clarity, switches S1, S2, S3, S1, S5, S6, S7 and S8 are drawn as solid lines where poles of the switches are closed, while non-functional circuitry (such as the open holes of switches and non-contributing circuitry) is not shown in FIG. 4.

The secondary pair 210 includes: (a) PMOS (P-type metal on silicon) transistors 212, 214, 216 and 218; and (b) resistor R201. The transistors 212 and 214 control and comprise the non-inverting "leg" of the secondary pair 210, whereas the transistors 216 and 218 control and comprise the inverting leg of the secondary pair 210. The source of the transistor 212 is coupled to the positive supply rail of the amplifier 130, while the drain of the transistor 212 is coupled to the source of the transistor 214 and a first terminal of the resistor R201. The source of the transistor 216 is coupled to the positive supply rail of the amplifier 130, and a drain of transistor 216 is coupled to the source of the transistor 218 and a second terminal of the resistor R201.

A common bias voltage phi ($\phi$) is used to equally bias the respective gates of the transistors 212 and 216 such that an equal amount of current respectively flows through the transistors 212 and 216. The resistor R201 is operable to generate a differential voltage across its first and second terminals in response to the respective currents of the transistors 214 and 218.

The gates of the transistors 214 and 218 are coupled to terminals of the amplifier 130. The gate of the transistor 214 is operable to control a current (e.g., the first positive input current) in response to the secondary pair non-inverting input of the amplifier 130, whereas transistor 218 is operable to control a current (e.g., the first negative input current) in response to the secondary pair inverting input of the amplifier 130.

The drain of the transistor 214 is coupled to (for example) the drain of the transistor 278 such that the current from the transistor 214 is summed with the current from the transistor 276. Similarly, the drain of the transistor 218 is coupled to (for example) the drain of the transistor 258 such that the current from the transistor 218 is summed with the current from the transistor 256.

The N-type main input pair 230 includes: (a) PMOS transistors 234, 232, 238 and 236; and (b) resistor R203. The transistors 234 and 232 control and comprise the inverting leg of the N-type main input pair 230, whereas the transistors 238 and 236 control and comprise the non-inverting leg of the main pair 230. The source of the transistor 234 is coupled to the negative supply rail (e.g., ground) of the amplifier 130, while the drain of the transistor 234 is coupled to the source of the transistor 232 and a first terminal of the resistor R203. The source of the transistor 238 is coupled to the negative supply rail of the amplifier 130, and a drain of transistor 238 is coupled to the source of the transistor 236 and a second terminal of the resistor R203.

The common bias voltage phi ($\phi$) is used to equally bias the respective gates of the transistors 234 and 238 such that an equal amount of current flows through the transistors 234 and 238. The resistor R202 is operable to generate a differential voltage across its first and second terminals in response to the respective currents of the transistors 232 and 236.

The gates of the transistors 232 and 236 are selectively coupled to terminals of the amplifier 130 in the high common mode input range operating mode. The transistor 232 is operable to control a current (e.g., a third negative input current) in response to the main pair inverting input of the amplifier 130, whereas transistor 236 is operable to control a current e.g., a third positive input current) in response to the main pair non-inverting input of the amplifier 130.

The drain of the transistor 232 is coupled to (for example) the drain of the transistor 252 such that the current from the transistor 232 is summed with the current from the transistor 252 and the transistor 250. Similarly, the drain of the transistor 236 is coupled to (for example) the drain of the transistor 272 such that the current of the transistor 236 is summed with the current from the transistor 272 and the transistor 270.

The active components of gain stage 240 include: (a) PMOS transistors 252, 254, 272, 264 and 284; and (b) NMOS (N-type metal on silicon) transistors 256, 258, 260, 276, 278, 280 and 282. The transistors 252, 254, 256, 258 and 260 control and comprise the "reference" leg of the gain stage 240, whereas the transistors 272, 274, 276, 278 and 280 control the "output" leg of the gain stage 240. The reference leg of the gain stage 240 generates the bias voltage (e.g., the voltage developed at the drain of the transistor 254) for the current mirror formed by transistors 252 and 272. The output leg includes transistors 282 and 284, which: (a) are arranged as a transmission gate; and (b) are operable to transmit the positive or negative current in either direction equally between the outputs (e.g., the drains of the transistors 274 and 276) of the gain stage 240.

The current mirror formed by the arrangement of the transistors 250, 252, 272 and 270 is operable to ensure an equal amount of current is supplied by the current mirror to each of the reference leg and the output leg of the gain stage 240. As described above, the outputs of the N-type main input pair 230 respectively contribute to each of the reference leg and the output leg of the gain stage 240. Accordingly, currents flow from the drain of the transistor 254 and from the drain of the transistor 274. The current at the drain of the transistors 258 affects the voltage developed between the drains of the transistor 254 and the transistor 256 (which is the bias voltage of the current mirror of the gain stage 240). Accordingly, the current in the output leg of the gain stage 240 is controlled in part by the current at the drain of the transistor 258.

The current in the output leg of the gain stage 240 is also controlled by the current at the drain of the transistor 278. The current at the drain of the transistor 278 affects the voltage developed at the drain of the transistor 276 (which is coupled to the gate of the output stage 290 transistor 294) as well as the voltage developed at the drain of the transistor 274 (276 (which is coupled to the gate of the output stage 290 transistor 292). Accordingly, each of the four inputs (e.g., the main pair inverting input, the main pair non-inverting input, the secondary pair inverting input, and the secondary pair non-inverting input) to the amplifier 130 potentially contribute to the output of the output stage 290.

The output stage 290 includes: a PMOS transistor 292; and an NMOS transistor 294. The drains of the transistors 292 and 294 are coupled together to form the node Vout. The transistors 292 and 294 amplify the input differential signals and generate a "one-sided" output in accordance with a predetermined gain factor. The amplification gain for operating in the high common mode input range operating mode is the same as the gain for operating in the low common mode input range operating mode discussed above with respect to FIG. 3. In an embodiment, an output of 300 millivolts is generated in response to differential input of 100 millivolts while operating in either the low common mode input range operating mode or the high common mode input range operating mode.

Figure 5:
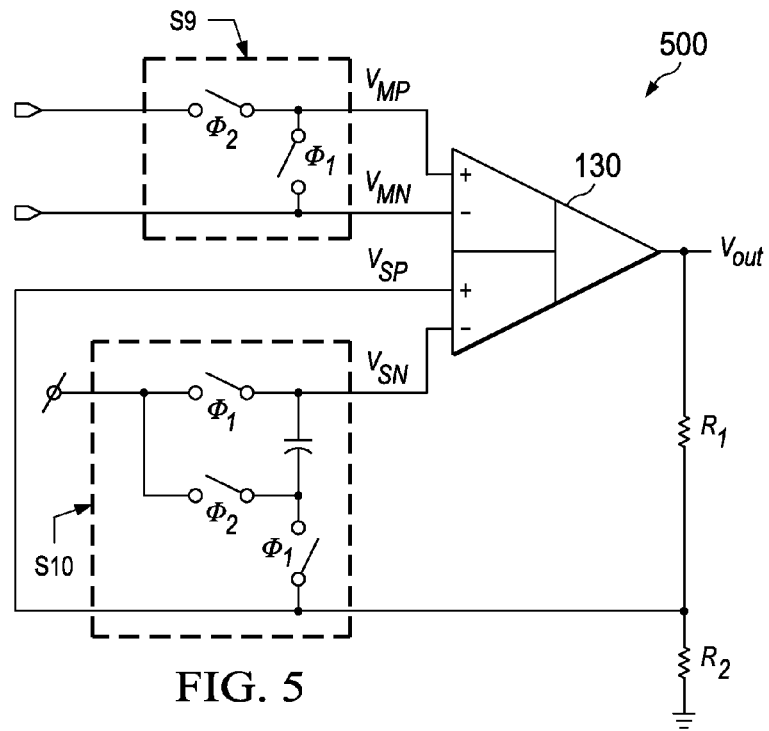
FIG. 5 is a schematic view of the amplifier 130 of FIG. 2 configurable for operating in a calibration mode and an operating mode.

FIG. 5 is a schematic view of the amplifier 130 of FIG. 2 configurable for operating in a calibration mode and an operating mode. The system 500 includes the amplifier 130, resistors R1 and R2, and switches S9 and S10. The switches S9 and S10 are operable to place the amplifier in: (a) a calibration mode; and (b) an operation mode. The switches S9 and S10 are operable in response to, for example, power-on self-test circuitry, which initially enters the calibration mode and then enters the operation mode at the conclusion of the calibration mode.

In the calibration mode, the poles φ1 of the switches S9 and S10 are open, whereas the poles φ2 of the switches S9 and S10 are closed. Accordingly the inputs $V_{MP}$ (e.g., voltage main positive) and $V_{MN}$ (e.g., voltage main negative) are selectively coupled together, while the capacitor $V_{off}$ (e.g., voltage offset) is coupled between the input $V_{SN}$ (e.g., voltage secondary negative) and the input $V_{SP}$ (e.g., voltage secondary positive). The voltage output ($V_{out}$) of the system 500 in the calibration mode is:

$$V_{out} = (1 + R_1/R_2) V_{off} \quad (2)$$

where $R_1$ and $R_2$ are the resistances of resistors R1 and R2 respectively and $V_{off}$ is the voltage supplied by signal φ.

In the operation mode, the poles φ1 of the switches S9 and S10 are closed, whereas the poles φ2 of the switches S9 and S10 are open. Accordingly the inputs $V_{MP}$ (e.g., voltage main positive) and $V_{MN}$ (e.g., voltage main negative) are not coupled together, while the capacitor $V_{off}$ (e.g., voltage offset) is coupled between the input $V_{SN}$ (e.g., voltage secondary negative) and the input $V_{SP}$ (e.g., voltage secondary positive). The voltage output ($V_{out}$) of the system 500 in the calibration mode is:

$$V_{out} (1 + R_1/R_2)((V_{MP} - V_{MN}) + V_{ref} \quad (3)$$

A calibration using the calibration mode is performed during the manufacturing process or is performed dynamically. When the calibration mode is performed dynamically (e.g., after deployment), the controller performing the calibration (e.g., controller 110), programs the capacitance of the (e.g., programmable) capacitor $V_{off}$ to match the performance of the amplifier 130.

Although illustrative embodiments have been shown and described by way of example, a wide range of alternative embodiments is possible within the scope of the foregoing disclosure.

What is claimed is:

1. A device, comprising:
    a first input pair for receiving a first differential signal coupled to a first inverting terminal and to a first non-inverting terminal, and, in response thereto, respectively generating a first negative input current and a first positive input current;
    a second input pair for receiving a second differential signal coupled to a second inverting terminal and to a second non-inverting terminal, and, in response thereto, respectively generating a second negative input current and a second positive input current when the device is operating in a first operating mode;
    a third input pair for receiving the second differential signal coupled between a third inverting terminal and a third non-inverting terminal, and, in response thereto, respectively generating a third negative input current and a third positive input current when the device is operating in a second operating mode; and
    a gain stage for: summing the first negative input current with the second negative input current when the device is operating in the first operating mode; summing the first positive input current with the second positive input current when the device is operating in the first operating mode; summing the first negative input current with the third negative input current when the device is operating in the second operating mode; and summing the first positive input current with the third positive input current when the device is operating in the second operating mode.

2. The device of claim 1, wherein: the second input pair includes PMOS (P-type metal on silicon) transistors; and the third input pair includes NMOS (N-type metal on silicon) transistors.

3. The device of claim 1, wherein: the first operating mode is a low common mode input range operating mode; and the second operating mode is a high common mode input range operating mode.

4. The device of claim 1, wherein the gain stage includes a current mirror for generating equal currents for each of a first leg and a second leg of the gain stage in response to a voltage generated at the drain of a first transistor of the first leg.

5. The device of claim 4, wherein the gain stage is for:
    receiving the first negative input current and the second negative input current at a source of a second transistor of the first leg when the device is operating in the first operating mode;
    receiving the first positive input current and the second positive input current at a source of a second transistor of the second leg when the device is operating in the first operating mode;
    receiving the first negative input current at a source of a second transistor of the first leg when the device is operating in the second operating mode;
    receiving the third negative input current at a source of a first transistor of the first leg when the device is operating in the second operating mode;

receiving the first positive input current at the source of the second transistor of the second leg when the device is operating in the second operating mode; and receiving the third positive input current at a source of a first transistor of the second leg when the device is operating in the second operating mode.

6. The device of claim 5, wherein: the first transistor of the first leg is a PMOS (P-type metal on silicon) transistor; the first transistor of the second leg is a PMOS transistor; the second transistor of the first leg is an NMOS (N-type metal on silicon) transistor; and the second transistor of the second line is an NMOS transistor.

7. The device of claim 1, wherein the gain of the device when operating in the first operating mode is substantially equal to the gain of the device when operating in the second operating mode.

8. A method, comprising:
receiving a first differential signal coupled to a first inverting terminal and to a first non-inverting terminal, and, in response thereto, respectively generating a first negative input current and a first positive input current;
receiving a second differential signal coupled to a second inverting terminal and to a second non-inverting terminal, and, in response thereto, respectively generating a second negative input current and a second positive input current when the device is operating in a first operating mode;
receiving the second differential signal coupled between a third inverting terminal and a third non-inverting terminal, and, in response thereto, respectively generating a third negative input current and a third positive input current when the device is operating in a second operating mode; and
summing: the first negative input current with the second negative input current when the device is operating in the first operating mode; the first positive input current with the second positive input current when the device is operating in the first operating mode; the first negative input current with the third negative input current when the device is operating in the second operating mode; and the first positive input current with the third positive input current when the device is operating in the second operating mode.

9. The method of claim 8, wherein: the first differential signal is received using gates of PMOS (P-type metal on silicon) transistors; the second differential signal is received using gates of PMOS transistors when the device is operating in the first operating mode; and the second differential signal is received using gates of NMOS (N-type metal on silicon) transistors.

10. The method of claim 8, wherein: the first operating mode is a low common mode input range operating mode; and the second operating mode is a high common mode input range operating mode.

11. The method of claim 8, wherein the summing of the first negative input current with the second negative input current when the device is operating in the first operating mode; the summing of the first positive input current with the second positive input current when the device is operating in the first operating mode; the summing of the first negative input current with the third negative input current when the device is operating in the second operating mode; and the summing of the first positive input current with the third positive input current when the device is operating in the second operating mode is performed using a current mirror for generating equal currents for each of a first leg and a second leg of a gain stage in response to a voltage generated at the drain of a first transistor of the first leg.

12. The method of claim 11, comprising:
receiving the first negative input current and the second negative input current at a source of a second transistor of the first leg when the device is operating in the first operating mode;
receiving the first positive input current and the second positive input current at a source of a second transistor of the second leg when the device is operating in the first operating mode;
receiving the first negative input current at a source of a second transistor of the first leg when the device is operating in the second operating mode;
receiving the third negative input current at a source of a first transistor of the first leg when the device is operating in the second operating mode;
receiving the first positive input current at the source of the second transistor of the second leg when the device is operating in the second operating mode; and
receiving the third positive input current at a source of a first transistor of the second leg when the device is operating in the second operating mode.

13. The method of claim 12, wherein: the first transistor of the first leg is a PMOS (P-type metal on silicon) transistor; the first transistor of the second leg is a PMOS transistor; the second transistor of the first leg is an NMOS (N-type metal on silicon) transistor; and the second transistor of the second line is an NMOS transistor.

14. A device, comprising:
a controller operable to select one of a first and second operating mode and to program switches in the device in accordance with the selected one of a first and second operating mode;
a first input pair for receiving a first differential signal coupled to a first inverting terminal and to a first non-inverting terminal, and, in response thereto, respectively generating a first negative input current and a first positive input current;
a second input pair for receiving a second differential signal coupled to a second inverting terminal and to a second non-inverting terminal, and, in response thereto, respectively generating a second negative input current and a second positive input current when the device is operating in a first operating mode;
a third input pair for receiving the second differential signal coupled between a third inverting terminal and a third non-inverting terminal, and, in response thereto, respectively generating a third negative input current and a third positive input current when the device is operating in a second operating mode; and
a gain stage for: summing the first negative input current with the second negative input current when the device is operating in the first operating mode; summing the first positive input current with the second positive input current when the device is operating in the first operating mode; summing the first negative input current with the third negative input current when the device is operating in the second operating mode; and summing the first positive input current with the third positive input current when the device is operating in the second operating mode.

15. The device of claim 14, wherein: the second input pair includes PMOS (P-type metal on silicon) transistors; and the third input pair includes NMOS (N-type metal on silicon) transistors.

16. The device of claim 15, wherein: the first operating mode is a low common mode input range operating mode; and the second operating mode is a high common mode input range operating mode.

17. The device of claim 16, wherein the gain of the device when operating in the first operating mode is substantially equal to the gain of the device when operating in the second operating mode.

\* \* \* \* \*